United States Patent
Tong et al.

(10) Patent No.: US 7,252,738 B2
(45) Date of Patent: Aug. 7, 2007

(54) APPARATUS FOR REDUCING POLYMER DEPOSITION ON A SUBSTRATE AND SUBSTRATE SUPPORT

(75) Inventors: Jose Tong, Pleasanton, CA (US); Eric H Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 665 days.

(21) Appl. No.: 10/251,179

(22) Filed: Sep. 20, 2002

(65) Prior Publication Data

US 2004/0083975 A1   May 6, 2004

(51) Int. Cl.
*H01L 21/00* (2006.01)
*C23C 16/00* (2006.01)

(52) U.S. Cl. ............ 156/915; 156/345.51; 156/345.52; 156/345; 156/53; 118/715; 118/728; 118/724

(58) Field of Classification Search ........... 156/915, 156/345.51, 345.52, 345.53; 118/715–730; 438/758

See application file for complete search history.

(56) References Cited

U.S. PATENT DOCUMENTS

| | | |
|---|---|---|
| 4,340,462 A | 7/1982 | Koch |
| 4,473,437 A | 9/1984 | Higashikawa et al. |
| 4,529,860 A | 7/1985 | Robb |
| 4,579,618 A | 4/1986 | Celestino et al. |
| 4,589,952 A | 5/1986 | Behringer et al. |
| 4,855,017 A | 8/1989 | Douglas |
| 4,948,458 A | 8/1990 | Ogle |
| 5,094,712 A | 3/1992 | Becker et al. |
| 5,200,232 A | 4/1993 | Tappan et al. |
| 5,217,920 A | 6/1993 | Mattox et al. |
| 5,262,029 A | 11/1993 | Erskine et al. |
| 5,298,465 A | 3/1994 | Levy |
| 5,326,725 A | 7/1994 | Sherstinksy et al. |
| 5,380,673 A | 1/1995 | Yang et al. |
| 5,498,313 A | 3/1996 | Bailey et al. |
| 5,516,367 A | 5/1996 | Lei et al. |
| 5,534,751 A | 7/1996 | Lenz et al. |
| 5,547,539 A | 8/1996 | Arasawa et al. |
| 5,552,124 A * | 9/1996 | Su .................... 156/345.1 |
| 5,556,476 A | 9/1996 | Lei et al. |
| 5,569,356 A | 10/1996 | Lenz et al. |
| 5,571,366 A | 11/1996 | Ishii et al. |

(Continued)

FOREIGN PATENT DOCUMENTS

DE    29813326 U    1/1999

(Continued)

OTHER PUBLICATIONS

Notification of Transmittal of the International Search Report or the Declaration for PCT/US03/27055 dated Dec. 30, 2003.

*Primary Examiner*—Ram N. Kackar
(74) *Attorney, Agent, or Firm*—Buchanan Ingersoll & Rooney PC

(57) ABSTRACT

An adjustable RF coupling ring is capable of reducing a vertical gap between a substrate and a hot edge ring in a vacuum processing chamber. The reduction of the gap reduces polymer deposits on the substrate and electrostatic chuck and improves wafer processing.

17 Claims, 4 Drawing Sheets

U.S. PATENT DOCUMENTS

| | | |
|---|---|---|
| 5,572,398 A | 11/1996 | Federlin et al. |
| 5,606,485 A | 2/1997 | Shamouilian et al. |
| 5,670,018 A | 9/1997 | Eckstein et al. |
| 5,671,116 A | 9/1997 | Husain |
| 5,740,009 A | 4/1998 | Pu et al. |
| 5,779,803 A | 7/1998 | Kurono et al. |
| 6,013,984 A | 1/2000 | Ellinger et al. |
| 6,123,775 A | 9/2000 | Hao et al. |
| 6,306,244 B1 | 10/2001 | Kennedy et al. |
| 6,383,931 B1 | 5/2002 | Flanner et al. |
| 6,391,787 B1 | 5/2002 | Dhindsa et al. |
| 6,464,794 B1 * | 10/2002 | Park et al. ............ 118/728 |
| 6,624,084 B2 * | 9/2003 | Maeda et al. .......... 438/732 |
| 6,726,799 B2 * | 4/2004 | Koike ................ 156/345.24 |
| 2001/0015262 A1 | 8/2001 | Denpoh |
| 2002/0072240 A1 | 6/2002 | Koike |
| 2003/0010452 A1 * | 1/2003 | Park et al. .......... 156/345.33 |

FOREIGN PATENT DOCUMENTS

| | | |
|---|---|---|
| DE | 10143719 A1 | 3/2003 |
| EP | 0 628 644 | 12/1994 |
| EP | 0 668 607 | 8/1995 |
| JP | 58087824 | 5/1983 |
| JP | 60170238 | 9/1985 |
| JP | 02011781 A * | 1/1990 |
| JP | 2000150623 A * | 5/2000 |

* cited by examiner

APPARATUS FOR REDUCING POLYMER DEPOSITION ON A SUBSTRATE AND SUBSTRATE SUPPORT

FIELD OF THE INVENTION

The invention relates to an apparatus and method for reducing polymer deposition on a substrate and substrate support, and more particularly, the invention relates to the adjustment of a gap between a substrate holder and a substrate to reduce polymer deposition on exposed surfaces of the substrate holder and bottom surfaces of the substrate.

DESCRIPTION OF THE RELATED ART

Vacuum processing chambers are generally used for chemical vapor depositing (CVD) and etching of materials on substrates by supplying process gas to the vacuum chamber and application of an RF field to the gas. Examples of parallel plate, inductively coupled plasma (TCP™, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. Pat. No. 5,671,116. Substrate holders in the form of an electrode can supply radio frequency (RF) power into the chamber, as disclosed in U.S. Pat. No. 4,579,618.

Substrates which are etched in an oxide etching process generally include an underlayer, an oxide layer which is to be etched, and a photoresist layer formed on top of the oxide layer. The oxide layer may be one of $SiO_2$, BPSG, PSG, or other oxide material. The underlayer may be Si, TiN, silicide, or other underlying layer or substrate material. During processing of substrates, unwanted polymer deposition on the surfaces of the chamber can occur. For instance, when the chamber heats up to above 80° C. during oxide etching, a reaction can occur wherein $CF_3$ forms $CF_2$ and HF. The formation of $CF_2$ leads to an increase in polymer deposition on surfaces within the chamber.

During etching of a substrate such as a semiconductor wafer in a plasma reactor, the polymer can build up on the cooled, exposed surfaces of the chamber including exposed surfaces of a substrate support such as an electrostatic chuck and other surfaces such as a dielectric annular cap/focus ring surrounding the substrate support. This buildup may cause problems if it flakes off and is carried onto the top surface of the electrostatic chuck. These contaminants on the top surface of the chuck can prevent the chuck from operating properly to hold the wafer securely. In addition, the contaminants can allow helium which is supplied under the wafer as a cooling medium to leak from beneath the wafer and reduce the wafer cooling. The contaminants can also be deposited on and adversely affect the wafer itself.

The buildup of polymer can be removed by a cleaning step performed between the processing of successive wafers. Generally, cleaning can be performed by injecting oxygen into the chamber, striking a plasma and reacting the oxygen with the deposited polymer to achieve an aggressive oxygen clean of the processing chamber.

The aggressive oxygen cleaning of the processing chamber is undesirable because it adds to the wafer cycle time, reducing through-put of the system. In addition, the aggressive oxygen clean will shorten the lives of members within the processing chamber due to ion bombardment of these members. As such, it would be desirable if substrate processing could be carried out without a need for the aggressive oxygen cleaning step to thereby shorten cycle time and extend the life of chamber components.

One example of a vacuum processing chamber 10 is illustrated in FIG. 1. The vacuum processing chamber 10 includes a substrate holder 12 including an electrode providing an RF bias to a substrate supported thereon. The substrate holder 12 includes an electrostatic clamp 14 for clamping the substrate. The substrate which is placed on the electrostatic clamp 14 is preferably cooled by helium backcooling (not shown) provided between the substrate and the electrostatic clamp. A ring 16 surrounds the electrostatic clamp 14. The ring 16 may be a ceramic focus ring; a combination of a focus ring, coupling ring, and edge ring; or another combination of rings.

The vacuum processing chamber 10 includes a source of energy for maintaining a high density (e.g. $10^{11}$-$10^{12}$ ions/$cm^3$) plasma in the chamber such as an antenna 18 (such as a planar spiral coil or other suitable design) which is positioned above the chamber and powered by a suitable RF source. A suitable RF impedance matching circuit, inductively couples RF into the chamber 10 so as to provide a high density plasma. The chamber 10 also includes a suitable vacuum pumping apparatus for maintaining the interior of the chamber at a desired pressure (e.g. below 50 mTorr, typically 1-20 mTorr). A dielectric window 20 (such as a uniformly thick and planar sheet of quartz, alumina, silicon nitride, etc.) is provided between the antenna 18 and the interior of the processing chamber 10 and forms the vacuum chamber wall at the top of the processing chamber 10. A dielectric gas distribution plate, commonly called a showerhead 22, may be provided beneath the window 20 and includes a plurality of openings such as circular holes (not shown) for delivering process gas supplied by a gas supply to the processing chamber 10. However, the gas distribution plate 22 can be omitted and process gas can be supplied to the chamber by other arrangements such as gas rings, etc.

One area in which deposits of polymer can occur in a processing chamber is a narrow gap 30 between the wafer supported on the electrostatic chuck 14 and the surrounding ring(s) 16. Specifically, a gap 30 is provided beneath the edge of the wafer which overhangs the surrounding ring. This gap 30 allows for manufacturing tolerances, thermal expansion and wear of the parts. However, process gas and volatile byproducts within the chamber 10 may migrate into the gap 30 and cause undesirable polymer deposits in the gap and on the underside edge of the wafer which may flake off and cause contamination of the wafer and/or chamber.

FIG. 2 is an enlarged cross sectional view of an outer portion of an electrostatic chuck 14' and surrounding rings including a focus ring 16', a coupling ring 40, and a hot edge ring 42.

As shown in the enlarged view of FIG. 3, when a substrate S in the form of a semiconductor wafer is positioned on the electrostatic chuck 14' and held in place by a suitable electrostatic clamping force a small vertical gap 30' is provided between an overhanging edge of the substrate S and a groove 44 provided in the edge of the hot edge ring 42. This vertical clearance gap 30' is designed to prevent the overhanging edge of the substrate S from being lifted and thereby avoid a reduction in clamping force applied by the electrostatic chuck 14'. However, this additional vertical clearance gap 30' provides additional opportunity for polymer buildup which may flake off and contaminate the substrate S or the electrostatic chuck 14'.

Thus, it would be desirable to reduce the vertical gap 30' between the hot edge ring 42 or other surrounding ring and the overhanging substrate edge.

SUMMARY OF THE INVENTION

The present invention relates to an apparatus for adjusting a gap between a ring surrounding substrate support and a substrate.

In accordance with one aspect of the invention the plasma processing apparatus comprises a processing chamber, a power source which energizes process gas in an interior of the processing chamber into a plasma state for processing a substrate, a substrate support which supports a substrate within the interior of the processing chamber, the substrate support having an upper surface, an upper ring surrounding the substrate support, the upper ring having a portion extending under a substrate when the substrate is located on the substrate support, and a coupling ring surrounding the substrate support, the coupling ring having a first ring rotatable with respect to a second ring to adjust height of the coupling ring and adjust a gap between the upper ring and the substrate.

In accordance with another aspect of the invention the plasma processing apparatus comprises a processing chamber, a process gas which energizes process gas in an interior of the processing chamber into a plasma state for processing a substrate, a substrate support which supports a substrate within the interior of the processing chamber, the substrate support having an upper surface, an upper ring surrounding the substrate support, the upper ring having a portion extending under a substrate when the substrate is located on the substrate support, and a coupling ring surrounding the substrate support, the coupling ring having a first ring rotatable with respect to a second ring to adjust height of the coupling ring and adjust a gap between the upper ring and the substrate.

In accordance with a further aspect of the invention the method of reducing polymer deposition on a substrate support in a plasma processing system comprises providing an adjustment mechanism for adjusting a gap between a substrate and a surrounding ring in a plasma processing apparatus, and adjusting the gap between the substrate and the surrounding ring by rotating a first ring with respect to a second ring of the adjustment mechanism.

BRIEF DESCRIPTION OF THE DRAWING FIGURES

The invention will now be described in greater detail with reference to the preferred embodiments illustrated in the accompanying drawings, in which like elements bear like reference numerals, and wherein.

DETAILED DESCRIPTION OF THE INVENTION

Figure 4:
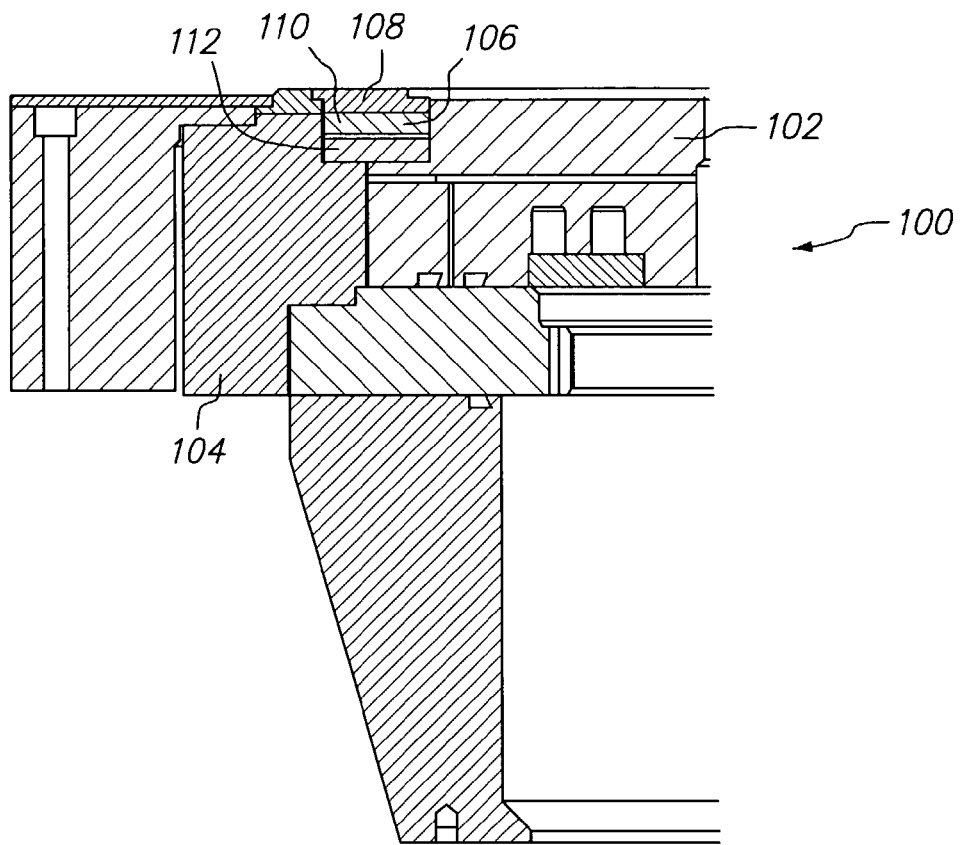
FIG. 4 is an enlarged cross sectional view of a portion of a vacuum processing chamber according to the present invention including an adjustable coupling ring.

A portion of a substrate support for a vacuum processing chamber according to one embodiment of the present invention is illustrated in FIG. 4. The substrate support 100 illustrated in FIG. 1 includes an electrostatic chuck 102, a focus ring 104, a coupling ring 106, and a hot edge ring 108.

As is well known to those familiar with the plasma processing art, the rings surrounding the electrostatic chuck including the focus ring 104, coupling ring 106, and hot edge ring 108 help focus the ions from the RF induced plasma region on the surface of the substrate to improve process uniformity, particularly at the edge of the substrate. This is because when RF power is supplied to substrate holding chuck 102, equipotential field lines are set up over substrate and bottom electrode. These field lines are not static but change during the RF cycle. The time averaged field results in the bulk plasma being positive and the surface of the substrate and electrostatic chuck negative. Due to geometry factors, the field lines are not uniform at the edge of the substrate. The focus, coupling, and hot edge rings help direct the bulk of the RF coupling through substrate to the overlying plasma by acting as a capacitor between the plasma and the powered electrode (e.g., RF-powered chuck ).

The hot edge ring 108 overlays an adjustable RF coupling ring 106. The hot edge ring 108 is a sacrificial edge ring surrounding the electrostatic chuck 102. The hot edge ring 108 is a replaceable component which tends to become hot during processing of a substrate and thus is referred to as a hot edge ring. The hot edge ring 108 may be made from conductive electrode materials such as SiC and silicon or from dielectric materials such as quartz. By changing the edge ring material, the degree of coupling through the plasma can be tailored to provide a desired localized "edge" etch rate at the outer portion of a substrate being processed. SiC, having a lower capacitive impedance, will generally produce a faster edge etch rate than silicon. Quartz and other dielectrics will have a lesser effect on the edge etch rate.

Figure 1:
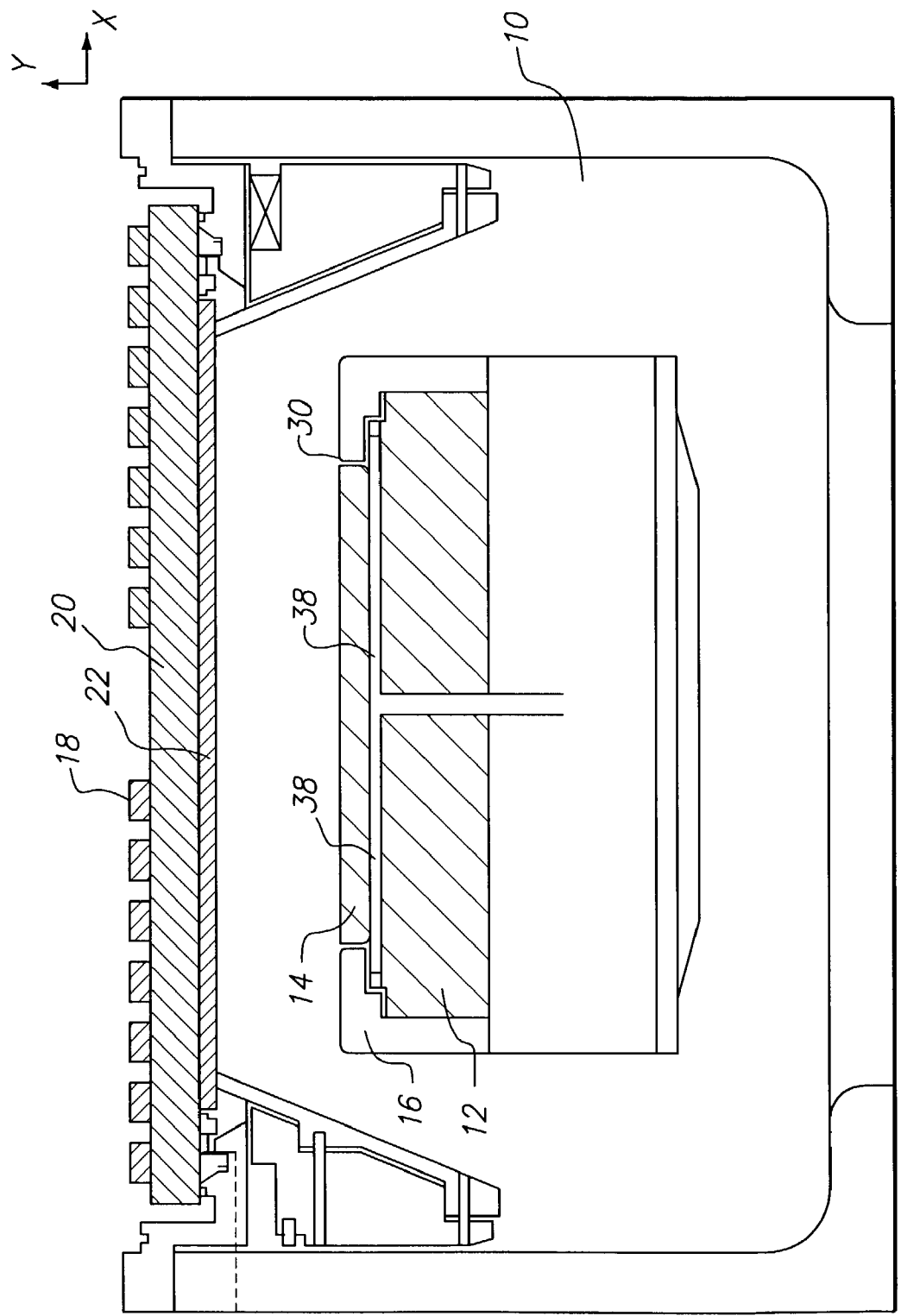
FIG. 1 is a cross sectional view of a vacuum processing chamber.
Figure 2:
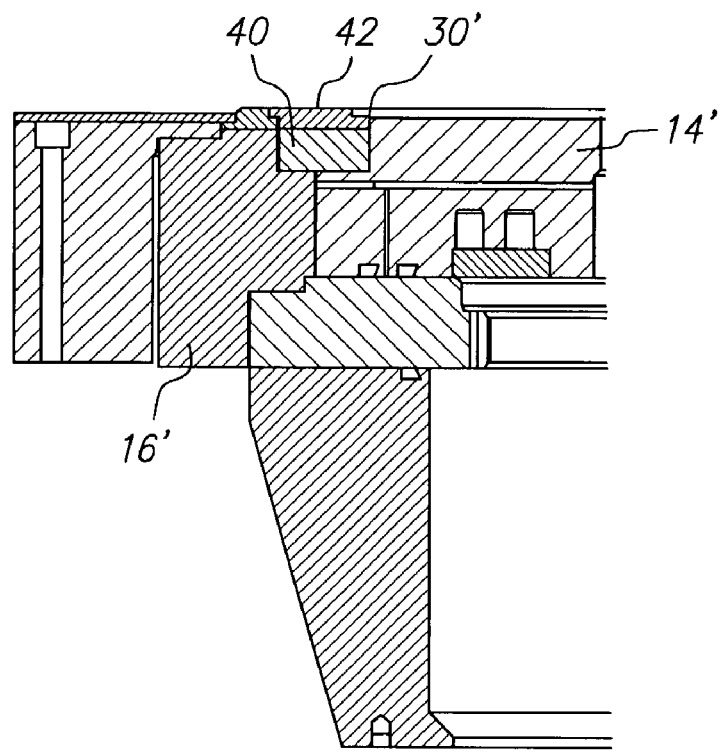
FIG. 2 is an enlarged cross sectional view of a portion of FIG. 1 showing the electrostatic chuck and surrounding rings.
Figure 3:
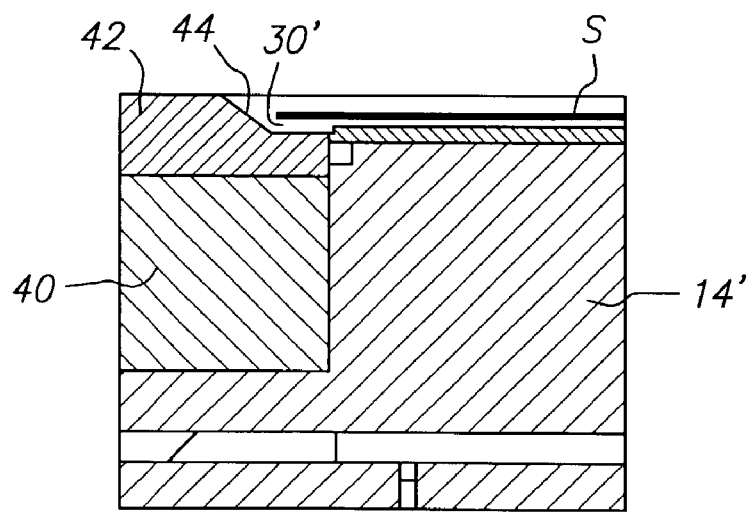
FIG. 3 is an enlarged cross sectional view of portion A of FIG. 2.
Figure 6:
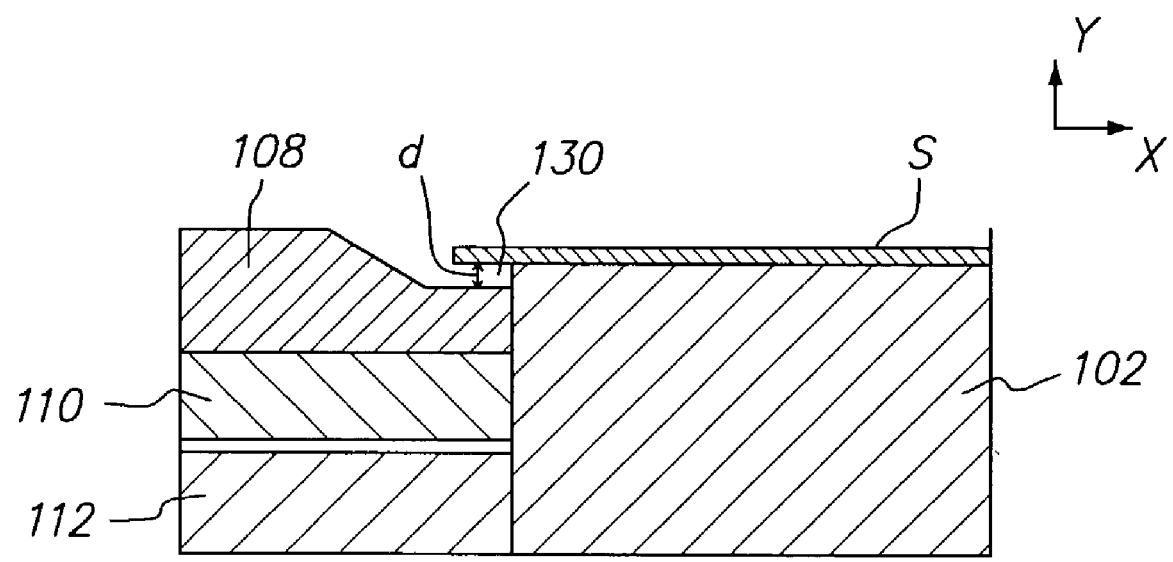
FIG. 6 is an enlarged cross sectional view of a portion of an electrostatic chuck and focus ring showing a gap between the focus ring and substrate.

In the described embodiment a gap 130, shown in FIG. 6, is formed between an over hanging edge of the substrate S and the silicon hot edge ring 108. The gap 130 has a vertical dimension d controlled by the adjustable RF coupling ring 106. The adjustable RF coupling ring 106 is capable of controlling the vertical dimension d of the gap by moving the silicon hot edge ring 108 in a vertical direction as appropriate. It should be noted that vertical direction is any direction substantially parallel to a Y axis, as shown in FIGS. 1 and 6.

In accordance with one embodiment of the invention, the adjustable RF coupling ring 106 moveably supports the silicon hot edge ring 108. The adjustable RF coupling ring 106 provides mechanical support for the silicon hot edge ring 108 as well as the capability to control the gap distance d to within a specified range. In one aspect of the invention, the adjustable RF coupling ring 106 is capable of forming the gap with an associated gap distance d ranging between approximately 0.5 mils to less than 6 mils.

Figure 5:
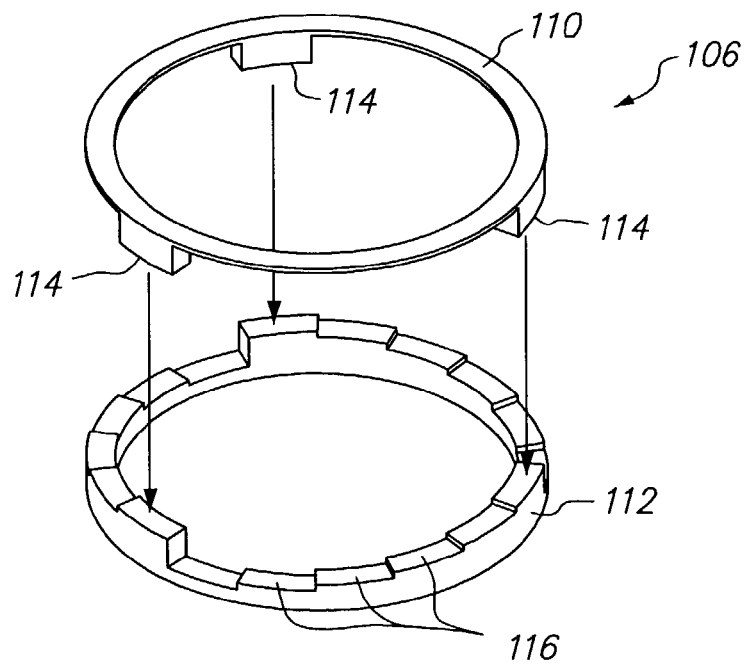
FIG. 5 is an exploded schematic prospective view of the adjustable coupling ring of FIG. 4.

In the described embodiment, the adjustable RF coupling ring 106 includes two rings 110, 112 as shown in FIG. 5. The first ring 110 or top ring includes three projections 114 extending from the ring in a direction parallel to a Y axis of the ring. The second ring 112 or bottom ring includes three sets of a plurality of graduated steps 116 around the circumference of the ring. Rotation of the first ring 110 clockwise with respect to the second ring 112 decreases an overall vertical height of the coupling ring 106 and adjusts the gap between the substrate and the hot edge ring 108.

In the described embodiment, the adjustable coupling ring 106 preferably includes graduated steps 116 that vary in height increments of about 0.0001-0.01 inches and preferably about 0.001 inches. Although the illustrated embodiment includes six graduated steps 116 in each of the three sets of steps, other numbers of steps may also be used depending on the amount of adjustment and graduation of adjustment desired. According to another embodiment twelve graduated steps 116 are provided for twelve adjustment heights.

In the described embodiment, the top ring 110 of an adjustable coupling ring 106 includes the projections 114 with a height which is equal to approximately the total height of all the steps 116 in one of the three sets of plurality of graduated steps. In a preferred embodiment, the projections 114 have a height of about 0.012 inches. In the described embodiment, the adjustable coupling ring 106 can be formed of quartz.

The adjustable RF coupling ring 106 according to the present invention, allows the precise adjustment of the gap 130 between the substrate S and the hot edge ring 108 in a plurality of individual steps. The coupling ring 106 allows an operator to readjust the coupling ring at any time between processing of substrates or during set up of the vacuum processing chamber. The RF coupling ring 106 also ensures that the hot edge ring 108 is adjusted evenly on all sides of the substrate and that a top surface of the coupling ring remains substantially horizontal.

The adjustable RF coupling ring 106 may be installed in new vacuum processing chambers or used to retrofit existing vacuum processing chambers to provide adjustability of the hot edge ring 108.

A process for installing and adjusting the adjustable RF coupling ring 106 is easily implemented as follows. The bottom ring 112 of the coupling ring 106 is placed on the step of the electrostatic chuck 102 with the plurality of graduated steps 116 facing upward. The top ring 110 is then placed onto the bottom ring 112 with the three projections 114 each aligned on the highest of the graduated steps. The hot edge ring 108 is then placed on top of the assembled coupling ring 106 and the gap is measured with a measuring device. One example of a measuring device is a vertical mount dial indicator which is placed on the substrate holding chuck 102 and measures a vertical distance from the top of the chuck to the top of the edge of the hot edge ring 108. Preferably, the gap 130 is measured at 90 degrees apart around the electrostatic chuck. The measurement is taken at a location on the hot edge ring 108 close to the electrostatic chuck 102. Due to deterioration or wear of the hot edge ring, just outside the edge of the substrate, the area of the hot edge ring 108 closest to the chuck 102 should be the highest location in the hot edge ring groove. The measurement will generally indicate that the hot edge ring 108 is higher than the electrostatic chuck 102 and that the hot edge ring needs to be adjusted downward. The hot edge ring 108 is then removed. The coupling ring 106 is then adjusted by rotating the top ring 110 clockwise and thus reducing the height of the coupling ring. The hot edge ring 18 is then replaced and the adjustment is then repeated until a minimum gap distance d is achieved.

According to one preferred embodiment of the invention, the rings 110 and 112 of the coupling ring 106 include a locking feature (not shown) which locks the rings in an aligned radial position. One example of a locking mechanism includes an detent on the top ring 110 which interlocks with grooves on each step of the bottom coupling ring 112.

It should be appreciated that in a specific system, the specific shape of the focus ring 104, the coupling ring 106, and the hot edge ring 108 may vary depending on the arrangement of chuck 102, substrate and/or others. Therefore, the exact shape of the rings surrounding the chuck in FIGS. 4-6 are shown for illustration purposes only and are not limiting in any way. Although the invention has been illustrated with a coupling ring arranged to adjust a hot edge ring, other rings may also be adjusted using the coupling ring.

While the invention has been described in detail with reference to the preferred embodiments thereof, it will be apparent to one skilled in the art that various changes and modifications can be made and equivalents employed, without departing from the present invention.

What is claimed is:

1. A plasma processing apparatus comprising:
   a processing chamber;
   a power source which energizes process gas in an interior of the processing chamber into a plasma state for processing a substrate;
   a substrate support which supports a substrate within the interior of the processing chamber, the substrate support having an upper surface;
   an upper ring surrounding the substrate support, the upper ring having a portion extending under a substrate when the substrate is located on the substrate support; and
   a coupling ring surrounding the substrate support, the coupling ring having a first ring rotatable with respect to a second ring to adjust height of the coupling ring and adjust a gap between the upper ring and the substrate.

2. The apparatus of claim 1, wherein the coupling ring is arranged to adjust a distance between a lower surface of the substrate and an upper surface of the portion of the upper ring extending under the substrate by rotation of the first ring with respect to the second ring.

3. The apparatus of claim 1, wherein the upper ring is a hot edge ring.

4. The apparatus of claim 1, wherein the second ring comprises a plurality of stepped surfaces.

5. The apparatus of claim 4, wherein the coupling ring comprises:
   a first ring having at least three projections extending from the ring in a direction parallel to an axis of the ring; and
   a second ring having at least three sets of a plurality of steps arranged to receive each of the at least three projections, wherein a total thickness of the first and second ring is adjustable by rotation of the first ring with respect to the second ring.

6. The apparatus of claim 5, wherein the steps each have a height of about 0.001 inches.

7. The apparatus of claim 5, wherein each of the sets of steps of the second ring includes steps having graduated heights.

8. The apparatus of claim 5, wherein the first ring is adapted to contact the second ring during rotation of the first ring with respect to the second ring.

9. The apparatus of claim 1, wherein the substrate support comprises an electrostatic chuck.

10. The apparatus of claim 1, wherein the coupling ring is of quartz.

11. The apparatus of claim 1, wherein the substrate support comprises an RF-powered chuck and the upper ring and the coupling ring are adapted to direct RF coupling through the substrate to overlying plasma when the substrate is located on the substrate support.

12. An adjustment mechanism for adjusting a gap between a substrate and a surrounding ring in a plasma processing apparatus, the adjustment mechanism comprising:
- a first ring having at least three projections extending from the first ring in a direction parallel to an axis of the first ring; and
- a second ring having at least three sets of a plurality of steps arranged to receive each of the at least three projections, wherein a total thickness of the first and second rings is adjustable by rotation of the first ring with respect to the second ring.

13. The adjustment mechanism of claim 12, wherein the steps each have a height of about 0.001 inches.

14. The adjustment mechanism of claim 12, wherein the first ring and second ring are of quartz.

15. The adjustment mechanism of claim 12, wherein each of the sets of steps of the second ring includes steps having graduated heights.

16. The adjustment mechanism of claim 12, wherein the first ring is adapted to contact the second ring during rotation of the first ring with respect to the second ring.

17. The adjustment mechanism of claim 12, wherein the first ring is adapted to be rotated manually with respect to the second ring.

* * * * *